(12) United States Patent
 Stutz

(10) Patent No.: US 10,114,121 B2
(45) Date of Patent: Oct. 30, 2018

(54) DISTANCE MEASURING METHOD AND DISTANCE MEASURING ELEMENT

(71) Applicant: LEICA GEOSYSTEMS AG, Heerbrugg (CH)

(72) Inventor: Reto Stutz, Berneck (CH)

(73) Assignee: LEICA GEOSYSTEMS AG, Heerburg (CH)

( * ) Notice: Subject to any disclaimer, the term of this patent is extended or adjusted under 35 U.S.C. 154(b) by 518 days.

(21) Appl. No.: 14/406,501

(22) PCT Filed: Jun. 24, 2013

(86) PCT No.: PCT/EP2013/063145
§ 371 (c)(1),
(2) Date: Dec. 8, 2014

(87) PCT Pub. No.: WO2014/001259
PCT Pub. Date: Jan. 3, 2014

(65) Prior Publication Data
US 2015/0168551 A1   Jun. 18, 2015

(30) Foreign Application Priority Data

Jun. 27, 2012   (EP) .................................... 12173911

(51) Int. Cl.
*G01C 3/08*   (2006.01)
*G01S 17/08*   (2006.01)
*G01S 7/486*   (2006.01)
*H03M 1/12*   (2006.01)

(52) U.S. Cl.
CPC ............ *G01S 17/08* (2013.01); *G01S 7/4861* (2013.01); *H03M 1/1245* (2013.01)

(58) Field of Classification Search
CPC ..... G01S 17/08; G01S 7/4861; H03M 1/1245
See application file for complete search history.

(56) References Cited

U.S. PATENT DOCUMENTS

| | | | |
|---|---|---|---|
| 4,958,231 A * | 9/1990 | Tsuchiya | ................... G01J 1/42 250/214 VT |
| 6,122,602 A | 9/2000 | Michalski et al. | |
| 7,602,322 B2 | 10/2009 | Tanimura et al. | |

(Continued)

FOREIGN PATENT DOCUMENTS

| CN | 101729043 A | 6/2010 |
|---|---|---|
| CN | 102064888 A | 5/2011 |

(Continued)

OTHER PUBLICATIONS

European Search Report dated Nov. 30, 2012 as received in Application No. EP 12 17 3911.

*Primary Examiner* — Samantha K Abraham
(74) *Attorney, Agent, or Firm* — Maschoff Brennan

(57) ABSTRACT

The invention relates to a distance measuring method comprising at least the step of emitting at least one measurement signal to a target object, in which at least one start signal is produced, and the measurement signal is back scattered from the target object as a target signal. Said target signal and optionally also the start signal is sampled in a first and a second sampling at various sampling rates and determines the distance to the target object from the relative position from the start signal and the target signal.

20 Claims, 10 Drawing Sheets

(56) References Cited

U.S. PATENT DOCUMENTS

| | | | |
|---|---|---|---|
| 7,911,589 B2 | 3/2011 | Siercks | |
| 8,031,103 B2 | 10/2011 | Chen et al. | |
| 2007/0090988 A1* | 4/2007 | Beharrell | G01S 7/021 342/13 |
| 2008/0304043 A1* | 12/2008 | Benz | G01S 7/4861 356/5.01 |
| 2012/0134665 A1* | 5/2012 | Lindsay | H04B 10/0799 398/16 |

FOREIGN PATENT DOCUMENTS

| | | |
|---|---|---|
| EP | 0 875 772 A2 | 11/1998 |
| EP | 1 882 959 A1 | 1/2008 |
| WO | 03/089950 A2 | 10/2003 |
| WO | WO2003089950 * | 10/2003 |
| WO | 2011/076907 A1 | 6/2011 |

* cited by examiner

DISTANCE MEASURING METHOD AND DISTANCE MEASURING ELEMENT

FIELD OF THE INVENTION

The invention relates to a distance measuring method and to a distance measuring element.

BACKGROUND

Various principles and methods are known in the field of electronic and electro-optical distance measurement. One approach consists in emitting pulsed electromagnetic radiation, such as e.g. laser light, to a target to be measured and then receiving an echo from said target as a backscattering object, wherein the distance to the target to be measured is determined on the basis of the time of flight of the pulse. Such pulse time-of-flight measuring elements have gained acceptance in the meantime as standard solutions in many fields.

Various approaches are used for detecting the backscattered pulse.

The so-called threshold value method involves detecting a light pulse if the intensity of the incident radiation exceeds a certain threshold value.

The other approach is based on the sampling of the backscattered pulse. An emitted signal is detected by virtue of the fact that the radiation detected by a detector is sampled, a signal is identified within the sampled region and, finally, the position of said signal is determined. By using a multiplicity of sample values, it is possible to identify a useful signal even under unfavorable circumstances, such that it is possible to cope with even relatively large distances or background scenarios that are noisy or beset by disturbances. In the prior art, sampling is effected by sampling many identical pulses with the time window or phase being shifted, wherein at the present time it is possible to realize very fast circuits having a frequency high enough to sample individual pulses.

The requirements made of the signal sampling and the prerequisites for signal reconstruction are problematic, however, particularly with the use of variable or distorted signals. On account of the sampling rates that are subject technically to upper limits, not all signal components can be sampled in the same way. If the so-called Nyquist sampling theorem is not complied with, then so-called aliasing effects can occur, which corrupt the signal reconstruction and thus reduce the measurement accuracy. The prior art discloses solutions here which nevertheless accept a slight violation of the Nyquist condition or else reduce the higher-frequency signal components by filtering to an extent such that the Nyquist condition can be fulfilled for the filtered signal.

In this regard, WO 2011/076907 discloses a device for highly accurate distance measurement according to the principle of direct sampling of the reflected signal, wherein the reception signal is sampled by a sampling circuit and subsequently quantized. Upstream of the sampling, a high-order filter is allocated to the reception signal path. Said filter is typically a 6th order filter or higher order filter and, unlike in the case of the other devices according to the prior art, is not designed as a simple 1st, 2nd or at most 3rd order antialiasing filter. In the case of such a distance measuring method, a complete identification of the waveform is no longer absolutely necessary. Since, before sampling, the signal bandwidth is reduced such that all frequencies relevant to the distance are below half the sampling frequency, according to the Nyquist theorem the distance-relevant signal that then remains and suffices for the intended measurement purpose can be completely reconstructed by algorithmic means and its exact position can therefore also be determined. The measurement still functions even in the case of varying signals and the accuracy can be increased by this approach. The prerequisite guides a reconstruction is, however, that the dominant portion of the signal must lie within a Nyquist band, the first frequency band preferably being used.

It is true that other methods or devices from the prior art comply with the Nyquist or Shannon condition to a first approximation. In this case, the bandwidth BW or the 3 dB fall-off point f3 dB of the signal spectrum is limited to frequencies below the Nyquist limit frequency fg. However, since the fall-off of the spectrum at frequencies above the BW or f3 dB is without exception too moderate on account of the low filter order, the Shannon theorem is not fulfilled 100% and the suppression of aliasing effects for a precise, offset-free distance measurement is not provided.

The solutions in the prior art thus use sophisticated filter concepts that ensure compliance with the sampling theorem, but they are unable to avoid aliasing effects to the extent required for highly precise measurements.

SUMMARY

Some embodiments of the present invention provide a novel distance measuring method and a novel distance measuring element by which these disadvantages are avoided or reduced.

Some embodiments provide a highly accurate distance measuring element and a distance measuring method without the need for filtering or else a reduced outlay on filtering before the sampling process.

Some embodiments provide a distance measuring element which enable accurate measurements even in the case of nonlinearly distorted pulses, such as e.g. in the case of signal saturation.

Some embodiments provide a distance measuring element which make it possible even to use higher-frequency signal components, in particular without restriction by the Shannon theorem.

Some embodiments provide a highly accurate distance measuring element which allows highly accurate measurement even with a simple construction, in particular with slow analog-to-digital converters.

Some embodiments further develop a distance measuring element according to the time-of-flight measuring method with signal sampling such that an absolute accuracy in the mm range or in the sub-mm range is ensured. The precision class of the distance measuring element according to the phase measuring principle is ideally intended to be achieved here.

The invention relates to distance measuring elements which emit a measurement signal to a target object whose distance is to be measured and, after an interaction with the target object, receive the reflected signal component again as a target signal and evaluate it. Light in the visible or invisible spectral range is typically used for this purpose, said light being generated for example by a laser diode, a solid-state laser, such as e.g. a Q-switched microchip laser, or an LED. In principle, however, the approach according to the invention can also be used for other types of measurement signal, such as e.g. ultrasonic measuring elements. In the case of laser distance measuring elements of the generic type, the distance is usually determined according to the time-of-flight measuring principle, i.e. from the temporal difference between reception of the start signal and of the target signal, at least the target signal being sampled for digitization.

The solution according to the invention is based on such an approach of sampling of the target signal by means of an analog-to-digital converter, but in contrast to the prior art uses different sampling rates or frequencies. The relative positions of the sampling points shift in relation to the signal as a result of these at least two sampling processes, with different sampling rates, of the target signal. Therefore, tuning the sampling rates permits passing over the signal profile with the sampling points such that, during the various sampling processes, the signal profile is sampled at in each case different positions. Information about the signal profile can be obtained from the totality of these sampling processes and the behavior thereof when tuning the sampling rates. In particular, this allows an optimized sampling rate to be determined, which permits highly accurate measurements for the respective distance or an assigned distance range. In the process, the sampling rate can be adapted in such a way that signals with an identical relative position in relation to the sampling pattern are sampled, wherein e.g. the peak point of a signal profile can serve as reference variable with regard to the position. The sampling of the same locations in the signal profile of the target and start signals is thus carried out with reference to a characteristic feature of the pulse profile, in this case the peak point. The sampling rate of the analog-to-digital converter and thus the sampling points of a sampling pattern defined by the sampling rate are thus adapted to a distance range, wherein effects that otherwise arise as a result of aliasing can be canceled or else taken into account algorithmically.

In the process, the repeated sampling, which is in any case performed at least twice, with different sampling rates probes the target signal, emitted in advance and backscattered again from a target, and at least one copy or a newly generated signal with the same signal profile. By way of example, the two signals to be sampled can be generated by virtue of a plurality of signals being emitted, received and sampled with different rates in the case of an unchanging distance or with known distance differences such that there is sequential sampling of target signals to the same target by different measurement processes. This therefore corresponds to renewed carrying out of the external part of the measurement process. Alternatively or in addition thereto, it is also possible for the receiver to have a multichannel design, e.g. by means of a beam splitter, wherein each one of the channels is sampled at a different rate. This corresponds to a parallelization of the internal part of the measurement process, wherein a copy of the signal is made available for each channel. If this multichannel property is combined with multiple emissions of signals, i.e. if both approaches for second sampling are realized simultaneously, a signal can always be sampled in parallel at different rates in two channels with in each case a dedicated analog-to-digital converter, wherein the sampling rates of the channels are varied in each case for each emitted signal.

After the sampling process, the distance is determined by means of time-of-flight methods, i.e. on the basis of a time measurement between the signals, to which time measurement a distance is assigned. Typically, individual pulses can be emitted in this case, but it is also possible according to the invention to use more complex signal structures or signal patterns.

The shifting of the sampling rate or sampling frequency can be used with various approaches.

A first approach uses a start signal which corresponds to the target signal and which is generated before or upon the emission of the measurement signal, e.g. by the use of an internal reference path via which part of the measurement signal is passed to the receiver internally in the device. Said start signal is likewise sampled by the receiver or the analog-to-digital converter in a manner identical to the target signal. By varying the sampling rate, it is possible for the sampling pattern assigned to the respective rate to be shifted such that the start and target signals are sampled in an identical manner, i.e. at identical points of the signal profile. Consequently, a complete reconstruction of the pulse is no longer necessary as long as the sampling rate is chosen such that the spacing between start signal and target signal corresponds to an integral multiple of the sampling interval, i.e. of the spacing between the sampling points. Both signals are then sampled at the same locations and thus in a directly comparable manner. Consequently, the sampling frequency of the analog-to-digital converter is adapted such that both signals lie identically, i.e. with an identical relative position with respect to the sampling points, in the sampling pattern. Errors that occur as a result of aliasing are duplicated during the sampling of both signals, i.e. both of the target signal and of the start signal, and can thus be subtracted or eliminated upon a comparison of both signals, if appropriate after amplitude matching.

This approach can also be carried out with only two sampling rates, if e.g. the first sampling process is employed as pre-measurement for determining a coarse distance. It is then possible, for example from a table, to select the sampling rate that is ideal for this distance on the basis of the coarse distance.

A different approach considers the target signal in an isolated way, wherein aliasing effects are determined. For this purpose the sampling pattern is shifted in relation to the signal profile by varying the sampling rate such that the signal profile is passed over or sampled at least in part. From the measurements, i.e. the change in the established signal profile or the established distance in relation to the change in the sampling rate, it is possible to determine the aliasing effect and eliminate the latter. In the case of this approach, it is advantageous if there is phase-locking or at least a defined phase angle for the various sampling rates such that there can be no undetermined phase shifts between the sampling processes when only sampling the target pulse. Alternatively or in addition thereto, the start signal used can also be an electronically generated start signal, for example, which need not be a copy of the target signal.

In principle, what the different sampling rate achieves is subsampling or a finer sampling of the signal in relation to a simple sampling.

If only the target signal is used, as is possible in the case of e.g. an electronically generated start signal, then the optimization of the signal position consists in putting said signal into an optimum position—for the evaluation—with respect to the sampling pattern. By way of example, the target signal can be placed into the sampling pattern such that the first derivative of the target signal at one sampling point or a set of sampling points assigned to temporal intervals is as large as possible, which corresponds to a maximization of the signal change per distance change.

In principle, the approach according to the invention can also be combined with methods from the prior art. In this regard, in particular, filter methods, as described in WO 2011/076907, for example, can also be used.

BRIEF DESCRIPTION OF THE DRAWINGS

The distance measuring method according to the invention and the distance measuring element according to the invention are described in greater detail purely by way of example below on the basis of exemplary embodiments illustrated schematically in the drawing.

In the figures, specifically.

DETAILED DESCRIPTION

Figure 1:
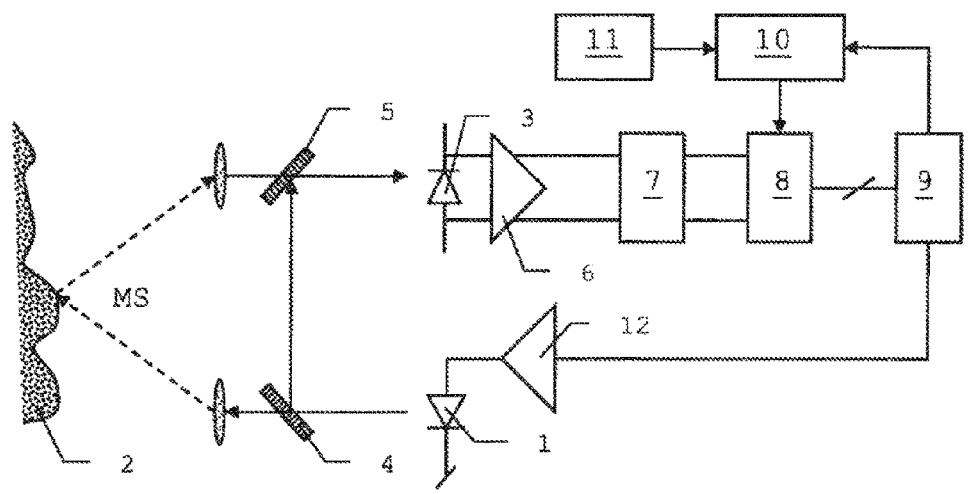
FIG. 1 shows a block diagram of one exemplary embodiment of the distance measuring element according to the invention.

FIG. 1 shows a block diagram of one exemplary embodiment of the distance measuring element according to the invention. The distance measuring element comprises a measurement signal source 1 for emitting at least one measurement signal MS, in particular a light signal, to a target object 2, wherein at least one start signal is generated. In particular, laser diodes, solid-state lasers or LEDs are appropriate as measurement signal source 1. The start signal can be provided as an electronically generated signal or else, as in this exemplary embodiment, can be generated by the splitting or changeover of the measurement signal MS. For this purpose, the measurement signal MS is passed e.g. via a beam splitter 4 and subsequently emitted to the target object 2. The other part of the measurement signal MS is passed via a device-internal reference path to a further beam splitter 5, where it is coupled back into the reception beam path. These arrangements thus define a device-external measurement section and a device-internal reference section, wherein the start signal is provided by coupling-out and the device-internal beam guiding. Besides the coupling-out by means of a beam splitter 4, it is also possible to realize successive passage through device-external measurement section and device-internal reference section, e.g. by means of a changeover element which releases in each case only one of the sections and is switched back and forth.

The measurement signal MS reflected from the target object 2 is passed to a receiver 3 for detection, where it is detected as a target signal and, downstream of an amplifier stage 6, is sampled by a downstream sampling circuit comprising an analog-to-digital converter 8 for determining the relative position of start signal and target signal. The sampling by the analog-to-digital converter 8 can be preceded by a filtering by a low-pass filter 7. The distance to the target object is determined from the relative position of start signal and target signal in a control and evaluation component 9.

For this purpose, the sampling circuit is designed in such a way that the target signal is sampled with at least two different sampling rates. In this case, the analog-to-digital converter 8 is controlled by the control and evaluation component 9 via a frequency generator 10, in particular a synthesizer, preferably a direct digital synthesizer or a fractional-N synthesizer, with reference clock 11 for frequency synthesis. The control and evaluation component 9 additionally controls the measurement signal source 1 via an amplifier stage 12, wherein the frequency of the measurement signal source 1 can also be correspondingly adjusted via a further frequency generator (not illustrated here), such that the frequencies of both receiver and source can be correspondingly adapted.

In this exemplary embodiment, at least two measurement signals respectively passed via device-external measurement section and device-internal reference section are sampled successively with different sampling rates. In this case, during each sampling process, start and target signals are analyzed jointly with one sampling rate in one process.

However, alternatively or additionally, the receiver and sampling circuit can also be designed and arranged in such a way that the measurement signal MS backscattered from the target object 2 is split on reception and sampled in parallel in two channels with the different sampling rates, in each case using an analog-to-digital converter 8.

In both alternatives, at least a second sampling of the target signal is effected, wherein a copy of the measurement signal backscattered from the target object or the result of a new transmission and reception process is sampled as target signal during the second sampling and the first and second sampling have different sampling rates.

Figure 2:
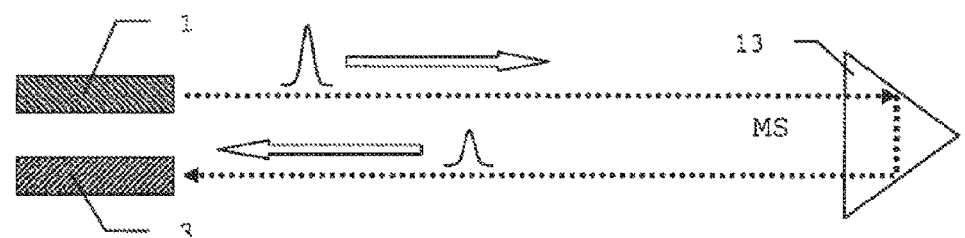
FIGS. 2-3 show the basic illustration of a distance measuring element according to the time-of-flight measuring principle according to the prior art.
Figure 3:
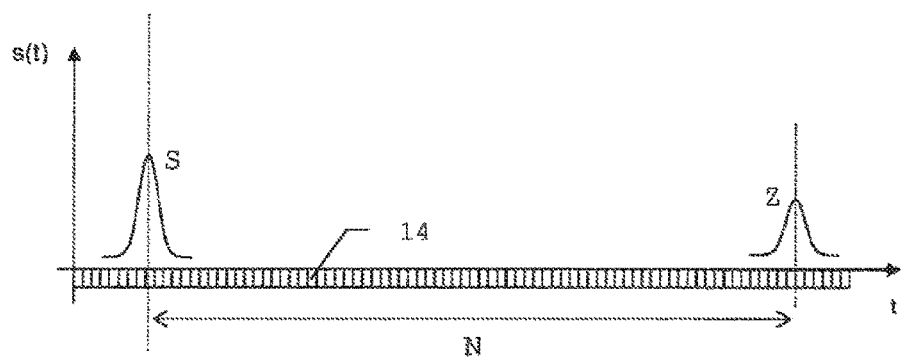

FIGS. 2-3 elucidate the time-of-flight measuring principle for a pulse time-of-flight distance measuring element according to the prior art. The measurement signal source 1 and the receiver 5 are arranged in the distance measuring element. The measurement signal source 1 emits a light pulse, which, after reflection or backscattering at a target, e.g. a retroreflector 13, is detected again as a backscattered light pulse by the receiver 5. Instead of the light pulses, a pattern, e.g. composed of a sequence of pulses, or a rectangular signal, can also be used as the measurement signal. Upon emission, part of the measurement signal for generating the start signal S is passed via the device-internal reference section, such that said signal is received earlier in time than the target signal Z reflected from the target object. This situation is illustrated in FIG. 3, wherein the signal pulses s(t) are plotted against time t and pulses are shown as signal waveforms. Start signal S and target signal Z are sampled jointly with one sampling rate by an analog-to-digital converter, wherein both signals lie in a in a sampling pattern composed of sampling intervals 14, said sampling pattern being defined by the sampling rate, and are spaced apart by a number N of sampling intervals. In methods from the prior art, start signal S and target signal Z are then detected at the sampling points, the signals are reconstructed and their temporal spacing is determined, for which purpose various basic methods are available, such as e.g. autocorrelation. From the temporal spacing, i.e. the signal time of flight via the device-external measurement section, the associated distance to the target is then determined in a known manner.

Figure 4:
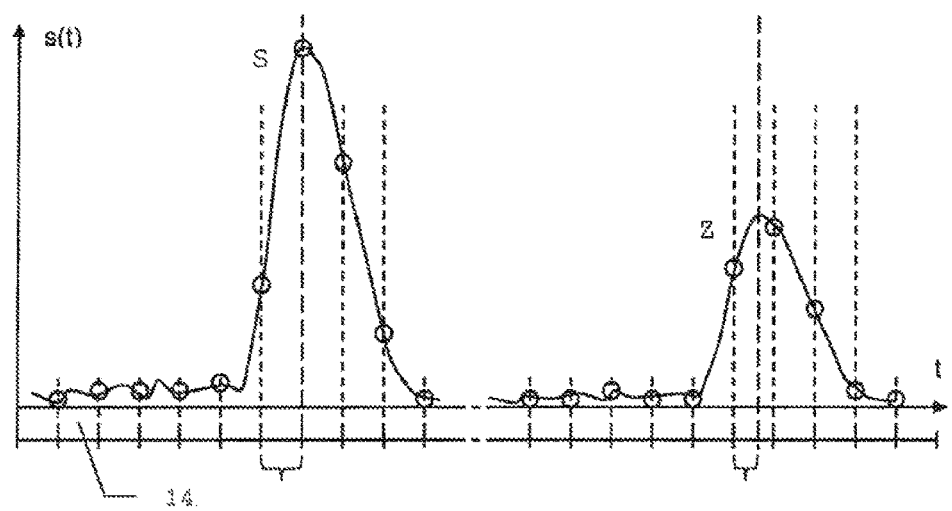
FIGS. 4-5 show the basic illustration of the distance measuring method according to the invention.
Figure 5:
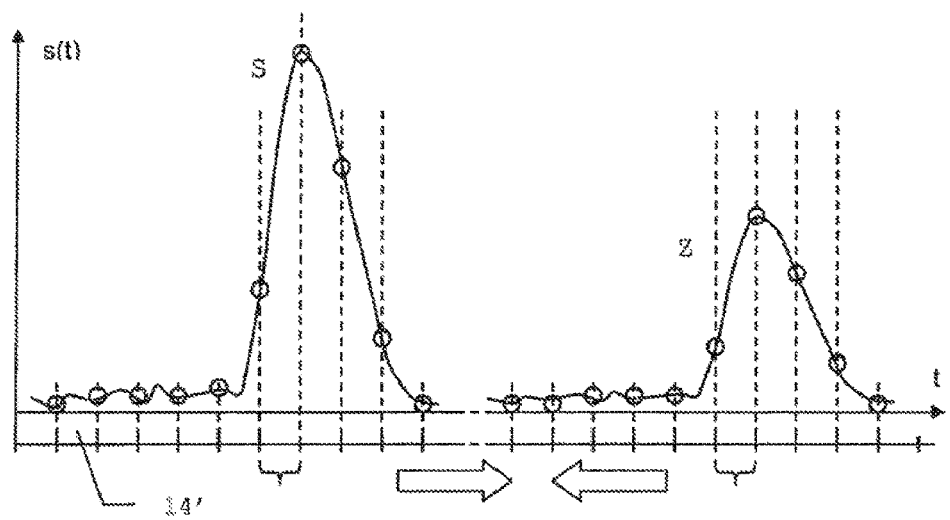

FIGS. 4-5 elucidate the distance measuring principle according to the invention. They show the enlarged excerpts corresponding to FIG. 3 for the start signal S and the target signal Z, wherein in this example the target signal Z is shown as an attenuated copy of the start signal S. In reality, however, distortions can also occur for the target signal Z. FIG. 4 reveals that start signal S and target signal Z have different relative positions in relation to the sampling pattern defined by sampling intervals 14, wherein the sampling intervals 14 constitute the time periods and thus spacings between two sampling points. In this regard, for the start signal S the peak point coincides with a sampling point, whereas the peak point for the target signal Z lies in the sampling interval and thus between two sampling points. Consequently, both signals are sampled at different points of their signal profile and aliasing effects can occur during the subsampling interpolation, said aliasing effects leading to errors in the distance measurement.

According to the invention, the same signal profile, i.e. a copy of start signal S and target signal Z, is sampled again or in parallel, wherein a different sampling rate is used, such that sampling takes place at other locations of the signal profile. In the example of the joint sampling of start signal S and target signal Z, these sampling locations shift along the signal profile. A situation that is desired according to the invention then occurs if the shortening of the sampling intervals 14' that is shown in FIG. 5 has the effect that start signal S and target signal Z are sampled with an identical phase angle, i.e. without a phase shift with respect to one another. In this case, edges and peak points of the two signals are sampled in an identical manner, such that both signals are positioned identically relative to the sampling pattern. It is likewise possible according to the invention to multiply repeat the emission and reception and sampling processes and to accumulate the sampled values for start signal S and/or target signal Z before determining their temporal spacing.

Here, the ideal sampling rate or sampling frequency can be determined by shifting, or else by targeted selecting. Thus, the sampling rate for the second sampling can be chosen on the basis of a result of the first sampling, in particular is determined on the basis of a coarse distance to the target object based on the first sampling. A different option consists in varying the sampling rate, wherein the variation of the distances determined therewith is analyzed and used as an optimality criterion. Also, the distance values determined for the plurality of sampling rates can be averaged.

In particular, the sampling rate for the second sampling can be selected on the basis of the knowledge of a coarse distance to the target object, wherein this coarse distance may also be determined by a different method, such as e.g. a pulse time-of-flight measurement according to the threshold value method, triangulation or else any other suitable method. In the case of measurement tasks with a sequence of many measurements and objects that are not structured to an excessively great extent, by way of example it is also possible to use previous measurements to neighboring points as coarse distances. In this case, the sampling rate can be selected by being taken from a table in which suitable sampling rates are assigned to coarse distances. Such tables can be created in particular on the basis of previous distance measuring processes.

The sampling rate for the second sampling can also be selected in accordance with the following relationship:

$$f_{n+1} = f_n \cdot \lfloor N \rfloor / N$$

wherein $f_{n+1}$ denotes the sampling rate to be selected for the second sampling, $f_n$ denotes the sampling rate for the first sampling, N denotes the number of sampling intervals 14 between the start signal S and the target signal Z, and $\lfloor N \rfloor$ denotes the rounding-down function for the number of sampling intervals 14 between the start signal S and the target signal Z at $f_n$.

Given a start sampling rate or frequency of $f_n$=500 MHz, by way of example N=789.358 results as the number of sampling intervals situated between start signal and target signal.

The associated distance D can be calculated in accordance with $$D = \frac{N}{f_n} \cdot \frac{C}{2} = 236.807 \text{ m},$$

wherein c denotes the speed of light.

The second sampling rate to be selected results in accordance with $$f_{n+1} = f \cdot \lfloor N \rfloor / N = 500 \text{ MHz} \cdot \frac{789}{789.358} = 499.773 \text{ MHz}$$

On the device side, this is realized by the sampling frequency of the analog-to-digital converter being generated by a frequency generator, such as e.g. a synthesizer (N, fractional N, or DDS (direct digital synthesizer)). This approach is limited by the setting accuracy of the frequency generator and the quality of the previous distance measurement or the previous samplings.

According to the invention, however, the sampling rate to be selected can also be selected in an analogous manner by means of a rounding-up function $\lceil N \rceil$, thus resulting in the following alternative relationship:

$$f_{n+1} = f_n \cdot \lceil N \rceil / N,$$

wherein rounding-down and rounding-up functions may also be expressed in terms of other relationships, such as e.g. in the following manner:

$$f_{n+1} = f_n \cdot (\lfloor N \rfloor + x)/N,$$

where x denotes an integer.

Another possibility according to the invention consists in varying the sampling rate for the second sampling until the first derivative of the signal or of the signal pulse at the sampling points of the target signal Z is maximal, or ending the variation if the first derivative decreases again. This approach can thus be restricted to the exclusive consideration of the variations of the target signal Z and thus also allows the use of an electronically generated start signal S, which can thus differ completely from the target signal Z in terms of its characteristic and its signal processing.

According to the invention, this approach of sampling with at least two different sampling rates can also be combined with a filtering, as described in WO 2011/076907, for example, such that the digitization is preceded by a filtering.

Figure 6A:
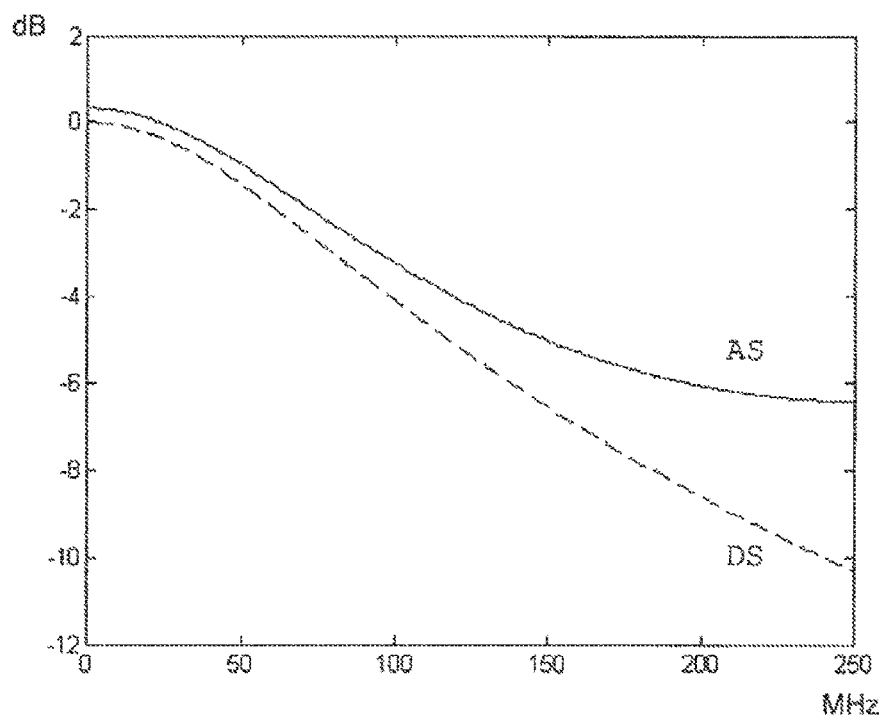
FIGS. 6a-b show the different spectra for 1st and 2nd order filters.
Figure 6B:
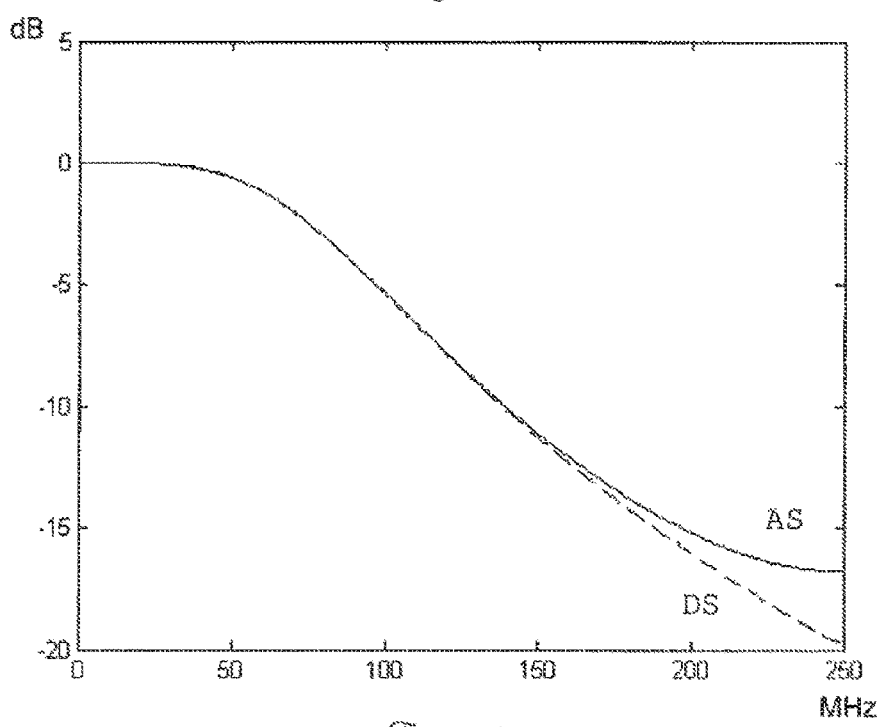

The different spectra of suitable first- and second-order filters are illustrated in FIGS. 6a-b, said filters being low-pass filter types having a 3 dB limit frequency BW of 80 MHz at a sampling rate of 500 MHz. The frequency in MHz is indicated on the horizontal axis and the attenuation in dB is indicated on the vertical axis, wherein the solid line represents the analog signal AS and the dashed lines represent the digital signal DS. FIG. 6a shows a first-order filter, and FIG. 6b shows a second-order filter.

Figure 7A:
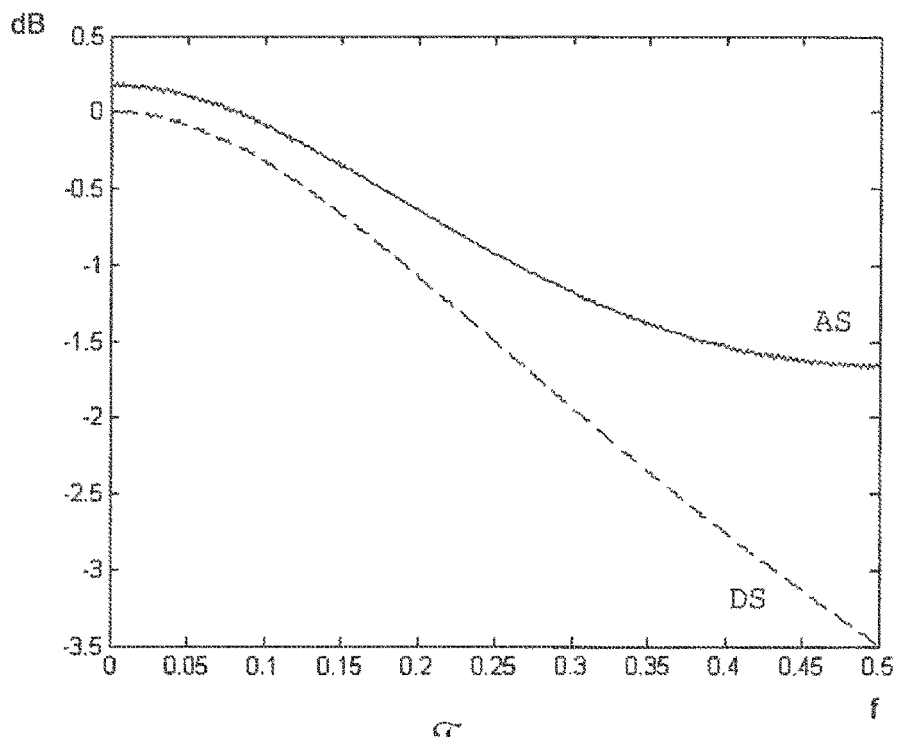
FIGS. 7a-b show the different spectra for 1st and 2nd order filters as a function of the sampling rate.
Figure 7B:
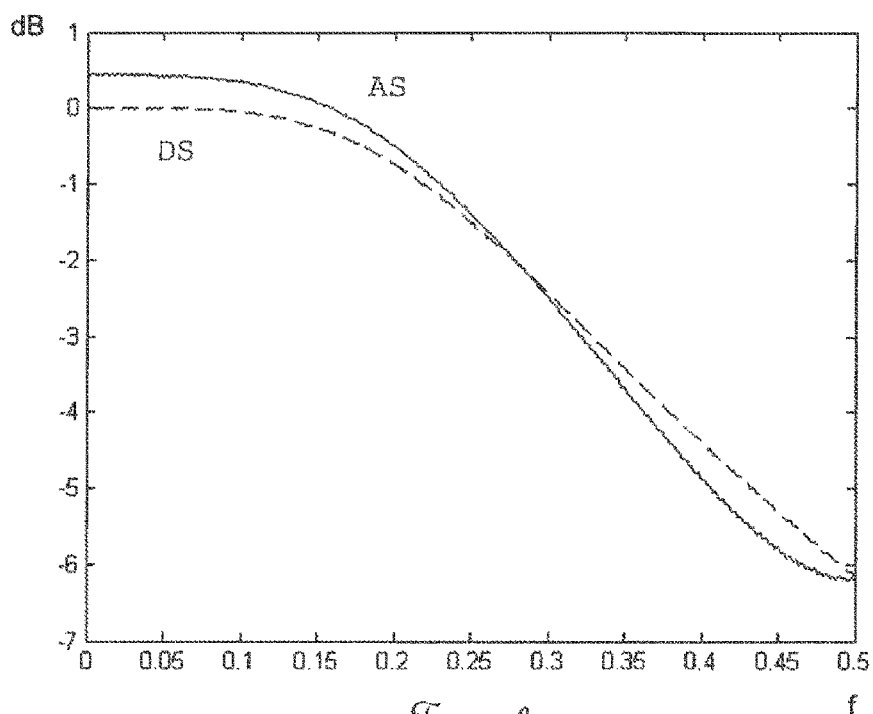

The spectra of the same filters are shown as a function of the sampling rate in FIGS. 7a-b, wherein the frequency in units of the sampling rate indicated on the vertical axis.

Figure 8A:
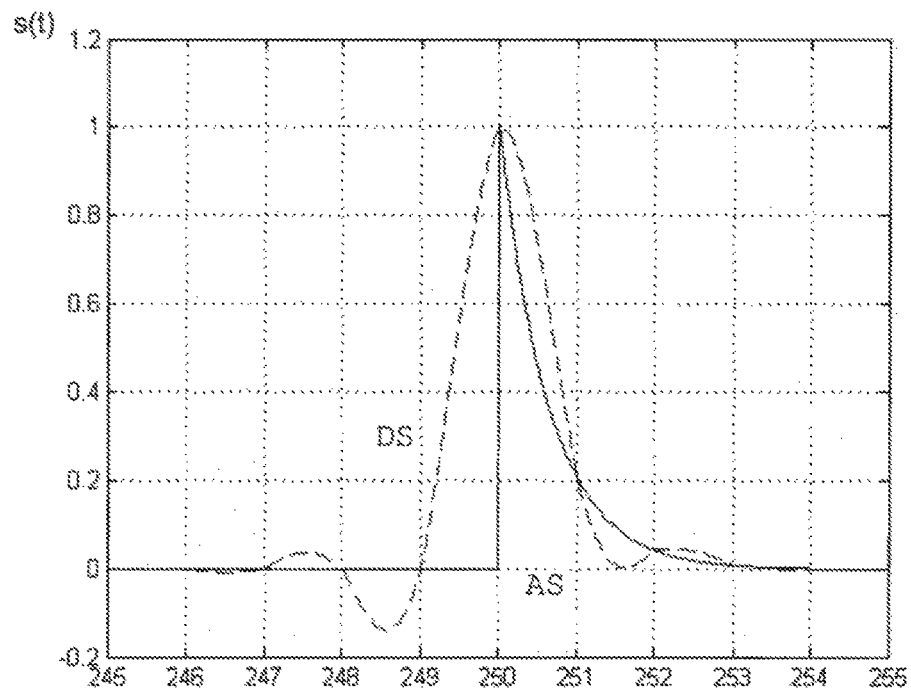
FIGS. 8a-c show the differences between analog time signal and digital signal interpolated therefrom for a 1st order filter and different relative positions between signal and sampling pattern.
Figure 8B:
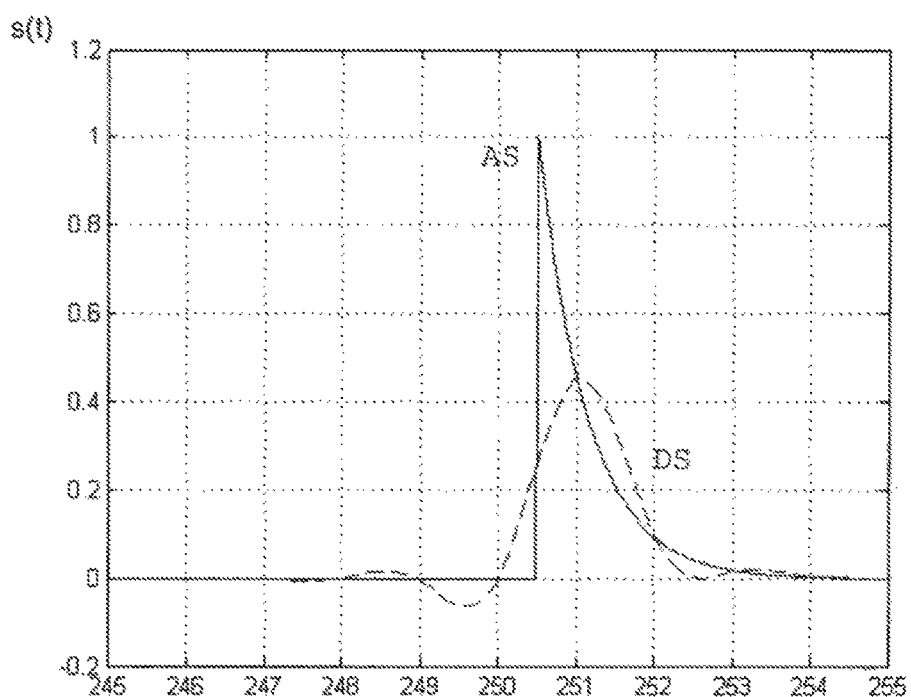
Figure 8C:
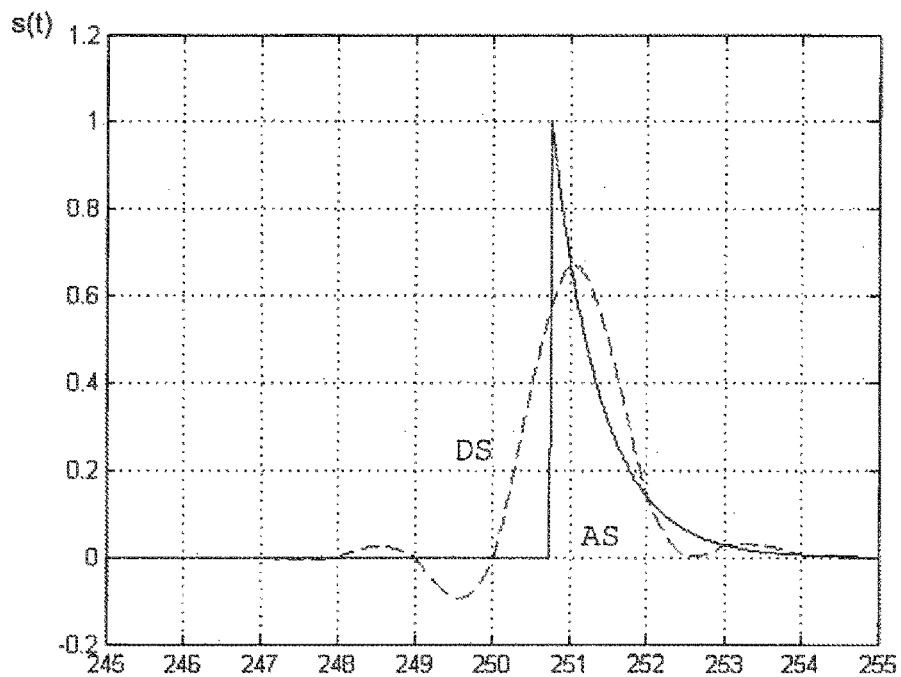

FIGS. 8a-c illustrate the differences between analog time signal AS and digital signal DS interpolated therefrom for a first-order filter and different exemplary relative positions between time signal and sampling pattern. The analog time signal AS depicted as a solid line is illustrated at three different positions in relation to the sampling pattern in FIGS. 8a-c. In FIG. 8a, the maximum of the time signal lies exactly at the sampling point of the sampling pattern that is marked with the time unit 250, wherein the digital signal DS interpolated from the sampled time signal AS has identical values at the sampling points and deviates in the intermediate regions. In FIG. 8a, the maximum of the time signal AS lies directly in the sampling pattern, wherein the maximum of the digital signal DS as a reconstruction is also situated at this location. In the following FIGS. 8b-c, the temporal position of the time signal AS shifts toward the right relative to the sampling pattern, such that the maximum of the time signal AS is now situated between the sampling points with the time units 250 and 251. It is evident that, in the case of these different relative positions, different positions of maximum and centroid of the digital signal DS also follow, thus giving rise to a dependence of the signal reconstruction on the relative position of the time signal AS in the sampling pattern, which leads to distance errors.

Figure 9A:
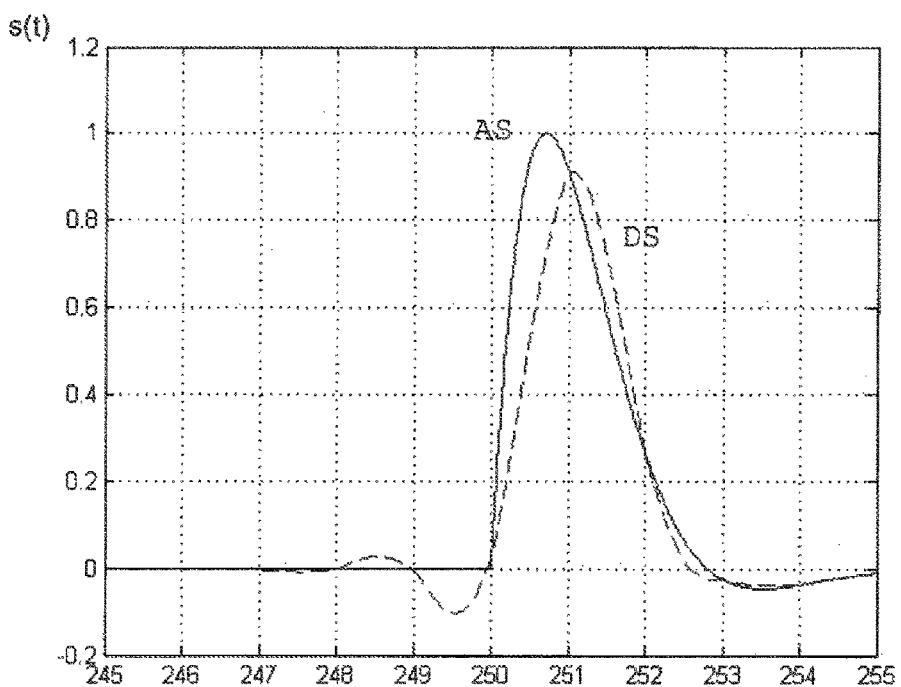
FIGS. 9a-c show the differences between analog time signal and digital signal interpolated therefrom for a 2nd order filter and different relative positions between signal and sampling pattern.
Figure 9B:
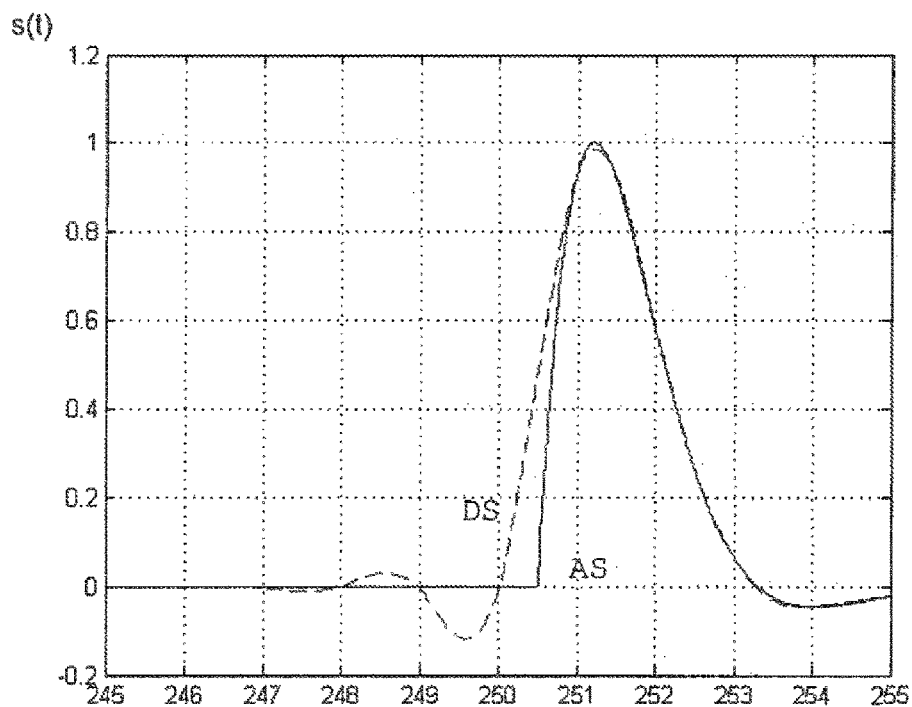
Figure 9C:
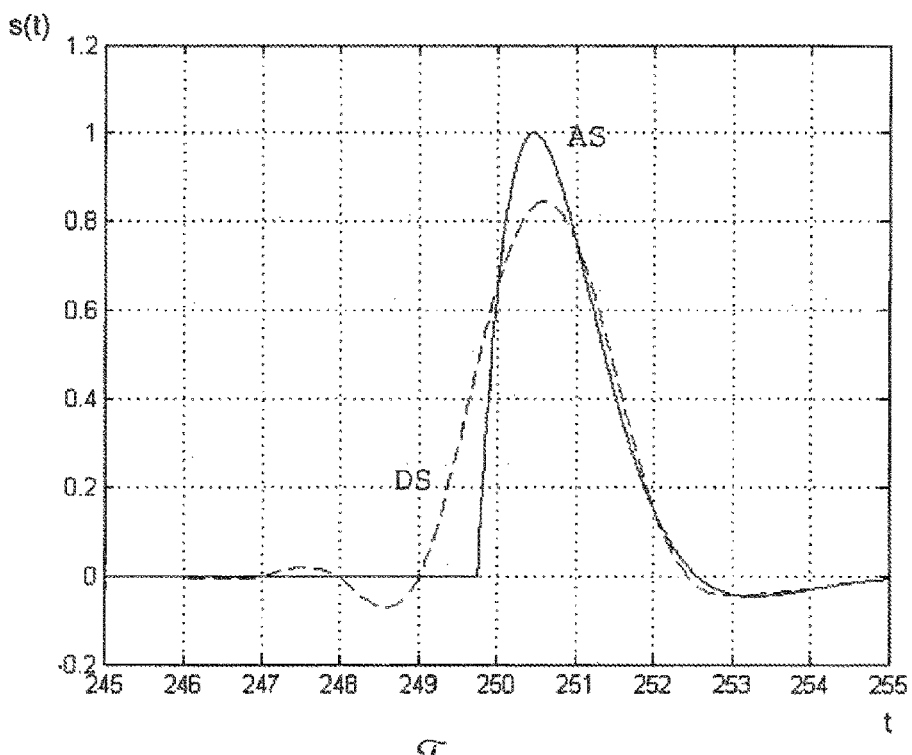

FIGS. 9a-c show the corresponding differences between analog time signal and digital signal interpolated therefrom for a second-order filter, wherein on account of the filtering the deviations between the signal profiles and thus also the distance errors turn out to be smaller.

Figure 10A:
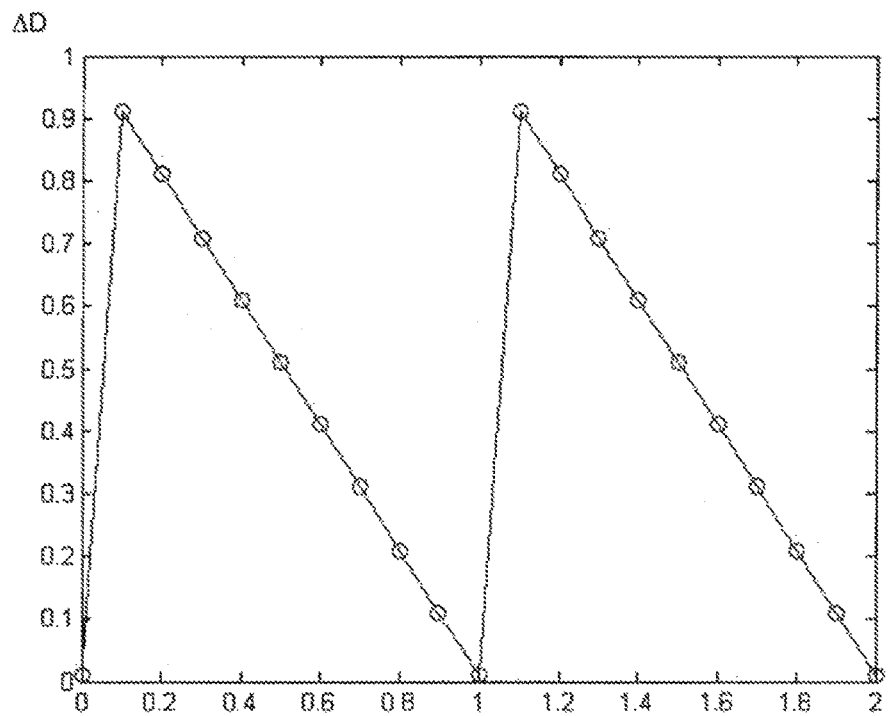
FIGS. 10a-b show the occurrence of distance errors during the sampling of a signal with filters of different orders and relative positions between signal and sampling pattern.
Figure 10B:
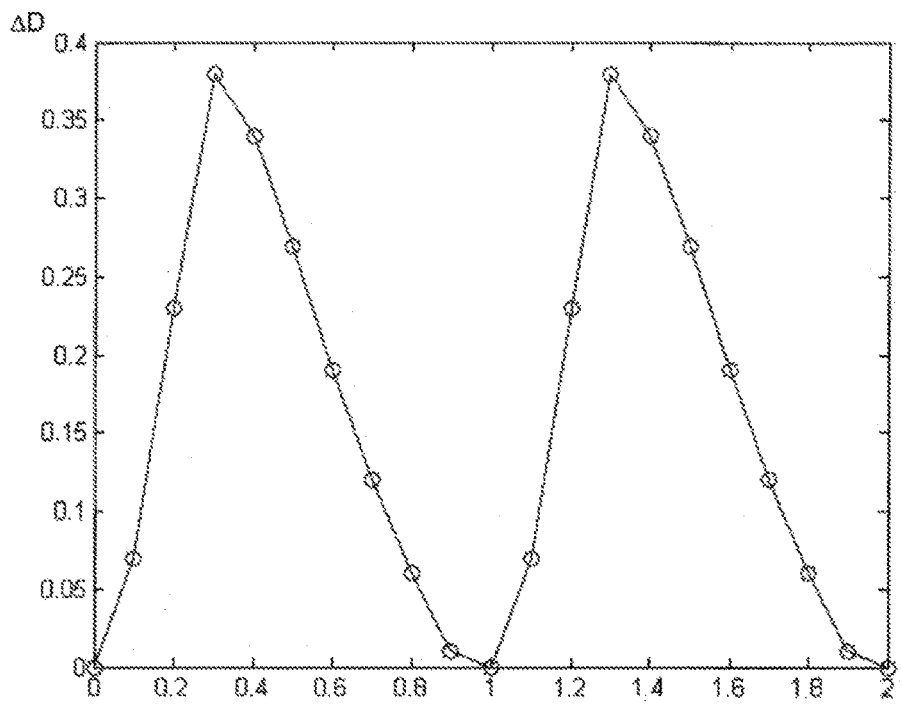

FIGS. 10a-b illustrate the occurrence of distance errors $\Delta D$ during the sampling of a signal with filters of different orders and relative positions between signal and sampling pattern. They show the error arising as a result of the different relative pattern positions during the determination of the temporal position of the signal to be reconstructed relative to a reference point in time, wherein the distance to be determined follows from the temporal position via the signal time of flight. The distance error becomes evident which arises if the position is determined by means of a digitally interpolated signal. The position of the maximum values of the analog signal and of the digitally interpolated signal is assumed as time position. The distance error $\Delta D$ as the difference between the position of the maximum values is shown on the vertical axis.

The horizontal axis denotes the shift of the sampling pattern in units of the spacing of the sampling points, i.e. the shift of the signal in relation to the sampling pattern. In the case of the first-order filter as illustrated in FIG. 10a, it is evident that the error rises linearly and the true distance is given only for the case of correspondence of maximum value and sampling point. FIG. 10b shows the same situation for a second-order filter.

The above consideration disregards the error that possibly arises from the additional sampling of a start signal or some other reference signal. This error is elucidated below in FIGS. 11a-b.

Figure 11A:
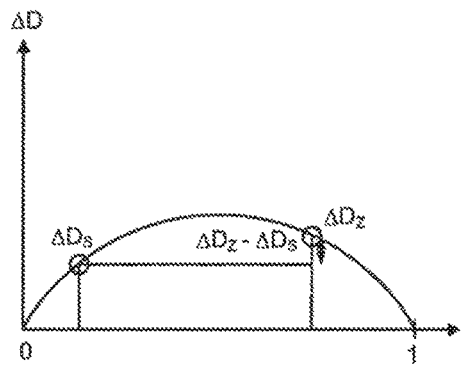
FIGS. 11a-b show the elucidation of the total errors for distance measuring methods from the prior art in comparison with the distance measuring method according to the invention.

FIG. 11a illustrates the error $\Delta D_S$, arising from aliasing effects, for the start signal and the error $\Delta D_Z$ for the target signal. This figure shows the distance error $\Delta D$ expressed in sampling intervals in relation to the shift—indicated on account of the periodicity in the interval zero to one—or relative position of the signal centroid with respect to the sampling pattern.

As is also known in the prior art, aliasing errors arise during the reconstruction of a signal. Said aliasing errors are all the greater, the further the signal centroids are shifted in relation to a sampling point of the sampling pattern. If two signals are compared with one another, a greater or lesser total error $\Delta D_Z$-$\Delta D_S$ of the distance to be determined arises depending on the difference between their sampling instants.

Figure 11B:
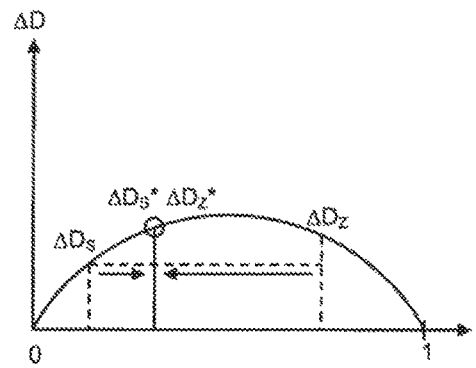

By contrast, if the start signal and target signal are sampled with an identical relative position or phase shift in relation to the sampling pattern, then the resulting error decreases on account of the difference formation, as is shown in FIG. 11b for the shift—brought about by the adaptation of the sampling rate—of the errors $\Delta D_S$ and $\Delta D_Z$ for the start and target signals to $\Delta D_S^*$ and $\Delta D_Z^*$.

Figure 12:
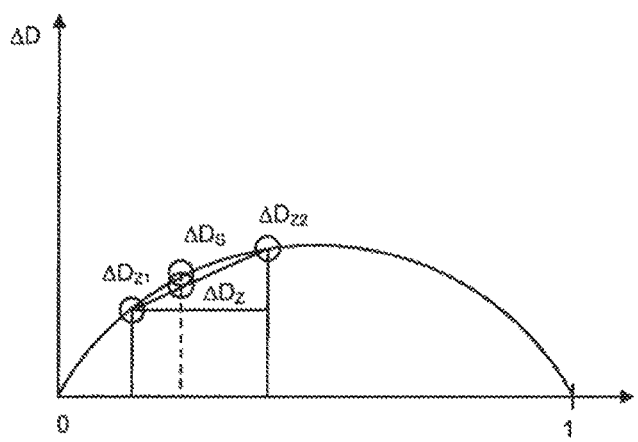
FIG. 12 shows the basic illustration of a linear interpolation according to the invention of the stop signal.

According to the invention, the errors occurring as a result of aliasing can also be identified or reduced or completely eliminated by multiple measurement of the same distance with different sampling rates. A first possibility is illustrated in FIG. 12 in the form of a linear interpolation of the target signal or stop signal. In this example, the target signal is sampled twice with different rates, wherein the latter are chosen such that the resulting shifts lie on both sides of the likewise sampled start signal. The two distance errors $\Delta D_{Z1}$ and $\Delta D_{Z2}$ for the two target signals and the distance error $\Delta D_S$ for the start signal unchanged in its relative position with respect to the sampling pattern are thus determined. From the two distance errors $\Delta D_{Z1}$ and $\Delta D_{Z2}$, by means of linear interpolation, it is subsequently possible to calculate a synthetic distance error $\Delta D_Z$ as an interpolated rather than directly measured value for a target signal shifted in relation to the sampling pattern by the same magnitude as the start signal. With the aid of this synthetic value, the error can then be largely or completely eliminated.

Figure 13:
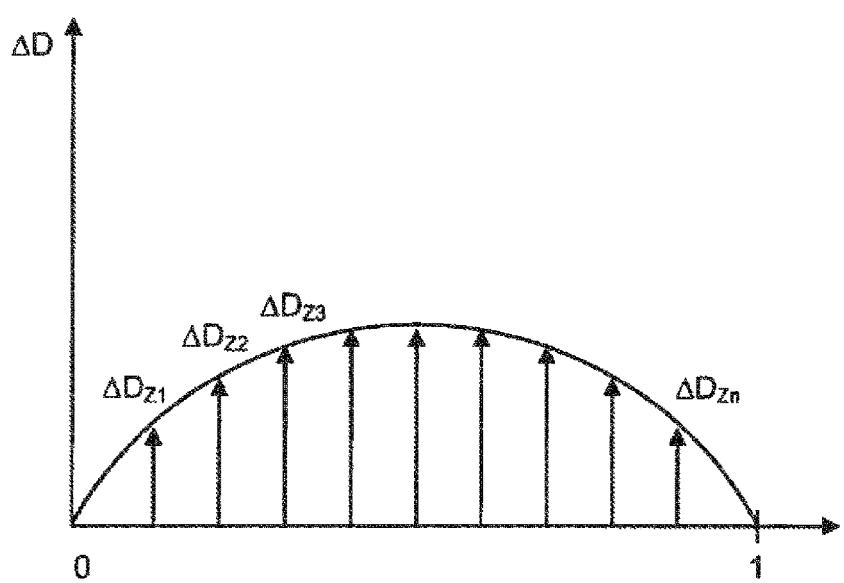
FIG. 13 shows the basic illustration of a look-up table creation according to the invention.

The systematic distance errors that occur in the case of corresponding shifts in relation to the sampling pattern can also be determined for different sampling rates, measurement distances and configurations, e.g. different target and signal waveforms, and can be stored in a table according to the invention. This case is shown in FIG. 13 in the form of a basic illustration of a look-up table creation according to the invention, which involves determining, for an unchanged distance and measurement configuration, the different distance errors $\Delta D_{Z1}$, $\Delta D_{Z2}$, $\Delta D_{Z3}$ to $\Delta D_{Zn}$ for n discrete sampling rates and, resulting therefrom, n equidistant shifts in relation to the sampling pattern.

What is claimed is:
1. A distance measuring method, comprising at least:
   emitting at least one measurement signal to a target object, wherein at least one start signal is generated;
   receiving the measurement signal backscattered from the target object as a target signal;
   performing a first sampling of the received target signal and determining the relative position of the start signal and the target signal;
   deriving a distance to the target object from the relative position of the start signal and the target signal being effected;
   wherein at least a second sampling of the received target signal is performed, wherein the first and second sam- pling have different sampling frequencies with a sampling pattern defined by the respective sampling frequency.

2. The distance measuring method as claimed in claim 1, wherein the sampling frequency for the second sampling is selected on the basis of a result of the first sampling.

3. The distance measuring method as claimed in claim 1, wherein the sampling frequency for the second sampling is selected on the basis of a distance to the target object based on the first sampling.

4. The distance measuring method as claimed in claim 1, wherein the sampling frequency for the second sampling is selected on the basis of the knowledge of a coarse distance to the target object.

5. The distance measuring method as claimed in claim 4, wherein the sampling frequency is taken from a table in which suitable sampling frequencies are defined by coarse distances in that the assignment of coarse distances to sampling frequencies is effected on the basis of previous distance measuring processes.

6. The distance measuring method as claimed in claim 1, wherein a synthetic distance error is determined for the target signal by linear interpolation of a target signal shifted in terms of its position.

7. The distance measuring method as claimed in claim 1, wherein a copy of the measurement signal is generated for the at least second sampling by splitting the measurement signal backscattered from the target object.

8. The distance measuring method as claimed in claim 1, wherein there is a repetition of the emission and reception of the measurement signal in the case of an unchanged distance or with known distance differences for the at least second sampling of the measurement signal.

9. The distance measuring method as claimed in claim 1, wherein the start signal and the target signal are sampled together during the first and/or second sampling, wherein the start signal is generated prior to the emission as a copy of the measurement signal, preferably by splitting the measurement signal.

10. The distance measuring method as claimed in claim 9, wherein the sampling frequency for the second sampling is varied until a respective position of start signal and target signal is the same relative to the sampling pattern defined by the respective sampling frequency such that start and target signal are sampled at the same positions of the respective signal profile.

11. The distance measuring method as claimed in claim 9, wherein:
the sampling frequency for the second sampling is selected in accordance with one of the following relationships:

$f_{n+1} = f_n \cdot (\lfloor N \rfloor + x)/N$ or $f_{n+1} = f_n \cdot \lfloor N \rfloor/N$ or $f_{n+1} = f_n \cdot \lceil N \rceil/N$, wherein:
fn+1 denotes the sampling frequency to be selected for the second sampling,
fn denotes the sampling frequency for the first sampling,
N denotes a number of sampling intervals between the start signal and the target signal,
x denotes an integer,
$\lfloor N \rfloor$ denotes a rounding-down function and
$\lceil N \rceil$ denotes a rounding-up function for the number of sampling intervals between the start signal and the target signal.

12. The distance measuring method as claimed in claim 1, wherein the sampling frequency for the second sampling is varied until the first derivative at the sampling points of the target signal is maximal.

13. The distance measuring method as claimed in claim 12, wherein the start signal is generated electronically.

14. The distance measuring element as claimed in claim 13, wherein the receiver and sampling circuit are designed and arranged in such a way that the measurement signal backscattered from the target object is split and sampled in parallel in two channels with the different sampling frequencies.

15. The distance measuring element as claimed in claim 13, wherein the at least one start signal is generated by splitting the measurement signal.

16. The distance measuring method as claimed in claim 1, wherein the measurement signal comprises a light signal.

17. The distance measuring method as claimed in claim 1, wherein the first sampling and the at least one second sampling are performed by an analog-to-digital converter.

18. A distance measuring element comprising at least:
a measurement signal source for emitting at least one measurement signal to a target object, wherein at least one start signal is generated, wherein part of the measurement signal is passed via an internal reference path;
a receiver for detecting the measurement signal backscattered from the target object as a target signal;
a sampling circuit for sampling the target signal for determining the relative position of the start signal and the target signal;
a control and evaluation component for deriving a distance to the target object from the relative position of the start signal and the target signal; wherein:
the sampling circuit is designed in such a way that the target signal is sampled with at least two different sampling frequencies and respectively assigned sampling patterns, wherein the respectively assigned sampling patterns are defined by the respective sampling frequencies.

19. The distance measuring element as claimed in claim 18, wherein the sampling circuit has a frequency generator.

20. The distance measuring element as claimed in claim 19, wherein the frequency generator is a synthesizer selected from at least one of a direct digital synthesizer and a fractional-N synthesizer.

* * * * *